United States Patent
Yun et al.

(10) Patent No.: US 8,811,087 B2
(45) Date of Patent: Aug. 19, 2014

(54) NON-VOLATILE MEMORY DEVICE AND RELATED READ METHOD

(75) Inventors: Eun-jin Yun, Seoul (KR); Sang-chul Kang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 365 days.

(21) Appl. No.: 13/291,389

(22) Filed: Nov. 8, 2011

(65) Prior Publication Data
US 2012/0213004 A1    Aug. 23, 2012

(30) Foreign Application Priority Data
Feb. 17, 2011    (KR) .................. 10-2011-0014143

(51) Int. Cl.
| | |
|---|---|
| *G11C 16/04* | (2006.01) |
| *G11C 16/06* | (2006.01) |
| *G11C 16/08* | (2006.01) |
| *G11C 16/24* | (2006.01) |
| *G11C 16/26* | (2006.01) |
| *G11C 16/34* | (2006.01) |

(52) U.S. Cl.
USPC ............ 365/185.18; 365/185.09; 365/185.17; 365/185.02; 365/185.21

(58) Field of Classification Search
CPC ........ G11C 16/00; G11C 16/02; G11C 16/04; G11C 16/0483; G11C 16/06; G11C 16/26; G11C 16/3418; G11C 16/3422; G11C 16/3427; G11C 16/3431; G11C 2216/12
USPC ............ 365/185.02, 185.09, 185.17, 185.18, 365/185.21
See application file for complete search history.

(56) References Cited

U.S. PATENT DOCUMENTS

| | | | |
|---|---|---|---|
| 2006/0109716 A1 | 5/2006 | Kim et al. | |
| 2006/0239081 A1* | 10/2006 | Roohparvar | ............. 365/185.22 |
| 2007/0291567 A1* | 12/2007 | Mokhlesi et al. | ............. 365/212 |
| 2008/0205163 A1 | 8/2008 | Park et al. | |
| 2010/0008150 A1* | 1/2010 | Hazama | ................... 365/185.22 |
| 2010/0329010 A1* | 12/2010 | Dong | ....................... 365/185.17 |
| 2011/0280084 A1* | 11/2011 | Radke et al. | ............. 365/185.21 |
| 2012/0081964 A1* | 4/2012 | Li | ............................. 365/185.17 |

FOREIGN PATENT DOCUMENTS

| | | |
|---|---|---|
| JP | 2010-020814 | 1/2010 |
| KR | 1020060056687 A | 5/2006 |
| KR | 1020080079572 A | 9/2008 |

* cited by examiner

*Primary Examiner* — J. H. Hur
(74) *Attorney, Agent, or Firm* — Volentine & Whitt, PLLC

(57) ABSTRACT

A nonvolatile memory device comprises a memory cell array and a voltage generator. The memory cell array comprises a plurality of memory cells connected in series between a string selection transistor connected to a bit line and a ground selection transistor connected to a source line. The voltage generator provides read voltages to word lines of memory cells selected from among the plurality of memory cells during a read operation. The read voltages of the selected memory cells differ from each other according to their respective distances from the string selection transistor.

14 Claims, 12 Drawing Sheets

FIG. 7

|  | VOLTAGE |  | VOLTAGE |  | VOLTAGE |  | VOLTAGE |
|---|---|---|---|---|---|---|---|
| WL0 | 2.00V | WL16 | 1.50V | WL32 | 1.00V | WL48 | 0.50V |
| WL1 | 2.00V | WL17 | 1.50V | WL33 | 1.00V | WL49 | 0.50V |
| WL2 | 2.00V | WL18 | 1.50V | WL34 | 1.00V | WL50 | 0.50V |
| WL3 | 2.00V | WL19 | 1.50V | WL35 | 1.00V | WL51 | 0.50V |
| WL4 | 2.00V | WL20 | 1.50V | WL36 | 1.00V | WL52 | 0.50V |
| WL5 | 2.00V | WL21 | 1.50V | WL37 | 1.00V | WL53 | 0.50V |
| WL6 | 2.00V | WL22 | 1.50V | WL38 | 1.00V | WL54 | 0.50V |
| WL7 | 2.00V | WL23 | 1.50V | WL39 | 1.00V | WL55 | 0.50V |
| WL8 | 2.00V | WL24 | 1.50V | WL40 | 1.00V | WL56 | 0V |
| WL9 | 2.00V | WL25 | 1.50V | WL41 | 1.00V | WL57 | 0V |
| WL10 | 2.00V | WL26 | 1.50V | WL42 | 0.50V | WL58 | 0V |
| WL11 | 2.00V | WL27 | 1.50V | WL43 | 0.50V | WL59 | 0V |
| WL12 | 2.00V | WL28 | 1.00V | WL44 | 0.50V | WL60 | 0V |
| WL13 | 2.00V | WL29 | 1.00V | WL45 | 0.50V | WL61 | 0V |
| WL14 | 1.50V | WL30 | 1.00V | WL46 | 0.50V | WL62 | 0V |
| WL15 | 1.50V | WL31 | 1.00V | WL47 | 0.50V | WL63 | 0V |

|  | VOLTAGE |  | VOLTAGE |  | VOLTAGE |  | VOLTAGE |
|---|---|---|---|---|---|---|---|
| WL0 | 2.00V | WL16 | 1.50V | WL32 | 1.00V | WL48 | 0.50V |
| WL1 | 2.00V | WL17 | 1.50V | WL33 | 1.00V | WL49 | 0.25V |
| WL2 | 2.00V | WL18 | 1.50V | WL34 | 1.00V | WL50 | 0.25V |
| WL3 | 2.00V | WL19 | 1.50V | WL35 | 0.75V | WL51 | 0.25V |
| WL4 | 2.00V | WL20 | 1.50V | WL36 | 0.75V | WL52 | 0.25V |
| WL5 | 2.00V | WL21 | 1.25V | WL37 | 0.75V | WL53 | 0.25V |
| WL6 | 2.00V | WL22 | 1.25V | WL38 | 0.75V | WL54 | 0.25V |
| WL7 | 1.75V | WL23 | 1.25V | WL39 | 0.75V | WL55 | 0.25V |
| WL8 | 1.75V | WL24 | 1.25V | WL40 | 0.75V | WL56 | 0V |
| WL9 | 1.75V | WL25 | 1.25V | WL41 | 0.75V | WL57 | 0V |
| WL10 | 1.75V | WL26 | 1.25V | WL42 | 0.50V | WL58 | 0V |
| WL11 | 1.75V | WL27 | 1.25V | WL43 | 0.50V | WL59 | 0V |
| WL12 | 1.75V | WL28 | 1.00V | WL44 | 0.50V | WL60 | 0V |
| WL13 | 1.75V | WL29 | 1.00V | WL45 | 0.50V | WL61 | 0V |
| WL14 | 1.50V | WL30 | 1.00V | WL46 | 0.50V | WL62 | 0V |
| WL15 | 1.50V | WL31 | 1.00V | WL47 | 0.50V | WL63 | 0V |

G10  WL0 ~ WL6     G15  WL35 ~ WL41
G11  WL7 ~ WL13    G16  WL42 ~ WL48
G12  WL14 ~ WL20   G17  WL49 ~ WL55
G13  WL21 ~ WL27   G18  WL56 ~ WL63
G14  WL28 ~ WL34

NON-VOLATILE MEMORY DEVICE AND RELATED READ METHOD

CROSS-REFERENCE TO RELATED APPLICATIONS

This application claims priority under 35 U.S.C. §119 to Korean Patent Application No. 10-2011-0014143 filed on Feb. 17, 2011, the disclosure of which is hereby incorporated by reference in its entirety.

BACKGROUND OF THE INVENTION

Embodiments of the inventive concept relate generally to electronic memory technologies. More particularly, embodiments of the inventive concept relate to nonvolatile memory devices and related methods for performing read operations.

Nonvolatile memory devices have been adopted for long-term data storage in a wide variety of technical applications, such as mobile phones, digital cameras, personal digital assistants (PDAs), mobile computers, desktop computers, and various others.

One popular type of nonvolatile memory device is a flash memory device. In a flash memory device, data is stored in a cell transistor by modifying its threshold voltage. For example, in a single-level cell flash memory device, a bit of data is stored in a cell transistor by modifying its threshold voltage between an erased state and a programmed state.

In general, the threshold voltage of a flash cell transistor is determined by a number of electrons stored in a floating gate of the flash cell transistor. As more electrons are stored in the floating gate, the threshold voltage of the cell transistor increases. Unfortunately, the floating gate of a cell transistor can lose stored electrons over time, which can lower the cell transistor's threshold voltage. As the floating gate loses stored electrons, the reliability of the cell transistor tends to deteriorate.

SUMMARY OF THE INVENTION

According to one embodiment of the inventive concept, a nonvolatile memory device comprises a memory cell array and a voltage generator. The memory cell array comprises a plurality of memory cells connected in series between a string selection transistor connected to a bit line and a ground selection transistor connected to a source line. The voltage generator provides read voltages to word lines of memory cells selected from among the plurality of memory cells during a read operation. The read voltages of the selected memory cells differ from each other according to their respective distances from the string selection transistor.

According to another embodiment of the inventive concept, a method is provided for reading a nonvolatile memory device comprising a plurality of strings each comprising a plurality of memory cells connected in series between a string selection transistor connected to a bit line and a ground selection transistor connected to a source line, wherein the memory cells of the plurality of strings are organized in pages each connected to a common word line and blocks each comprising a plurality of pages. The method comprises identifying a number of program/erase cycles of a page in a block corresponding to an address received with a read instruction, and performing a read operation by adjusting a read voltage applied to the page according to a distance between the page and the string selection transistor.

According to still another embodiment of the inventive concept, a method is provided for reading a nonvolatile memory device comprising memory cells organized in blocks each comprising a plurality of pages. The method comprises receiving a read instruction designating a selected block of memory cells, identifying a number of program/erase (P/E) cycles for a selected page within the selected block, adjusting a read voltage or a bit line connection signal for the selected page according to the number of P/E cycles and a distance between the selected page and a string selection transistor or a ground selection transistor, and performing a read operation on the selected page using the adjusted read voltage or bit line connection signal.

BRIEF DESCRIPTION OF THE DRAWINGS

The drawings illustrate selected embodiments of the inventive concept. In the drawings, like reference numbers indicate like features.

FIGS. 7 and 8 are tables illustrating reading voltages applied to grouped pages of memory cells according to an embodiment of the inventive concept.

DETAILED DESCRIPTION

Selected embodiments of the inventive concept are described below with reference to the corresponding drawings. These embodiments are presented as teaching examples and should not be construed to limit the scope of the inventive concept.

The terminology used herein is for the purpose of describing particular embodiments only and is not intended to be limiting of the inventive concept. As used herein, the singular forms "a," "an," and "the," are intended to encompass the plural forms as well, unless the context clearly indicates otherwise. It will be further understood that the terms "comprises," "comprising," "includes," and/or "including," when used herein, specify the presence of stated features, but do not preclude the presence or addition of one or more other features.

Unless otherwise defined, all terms used in this description, including technical and scientific terms, have the same meaning as generally understood by those skilled in the art. Terms defined in common dictionaries should be construed as having their ordinary meaning in the relevant technical context, and should not be construed in an idealized manner unless expressly so defined herein.

Figure 1:
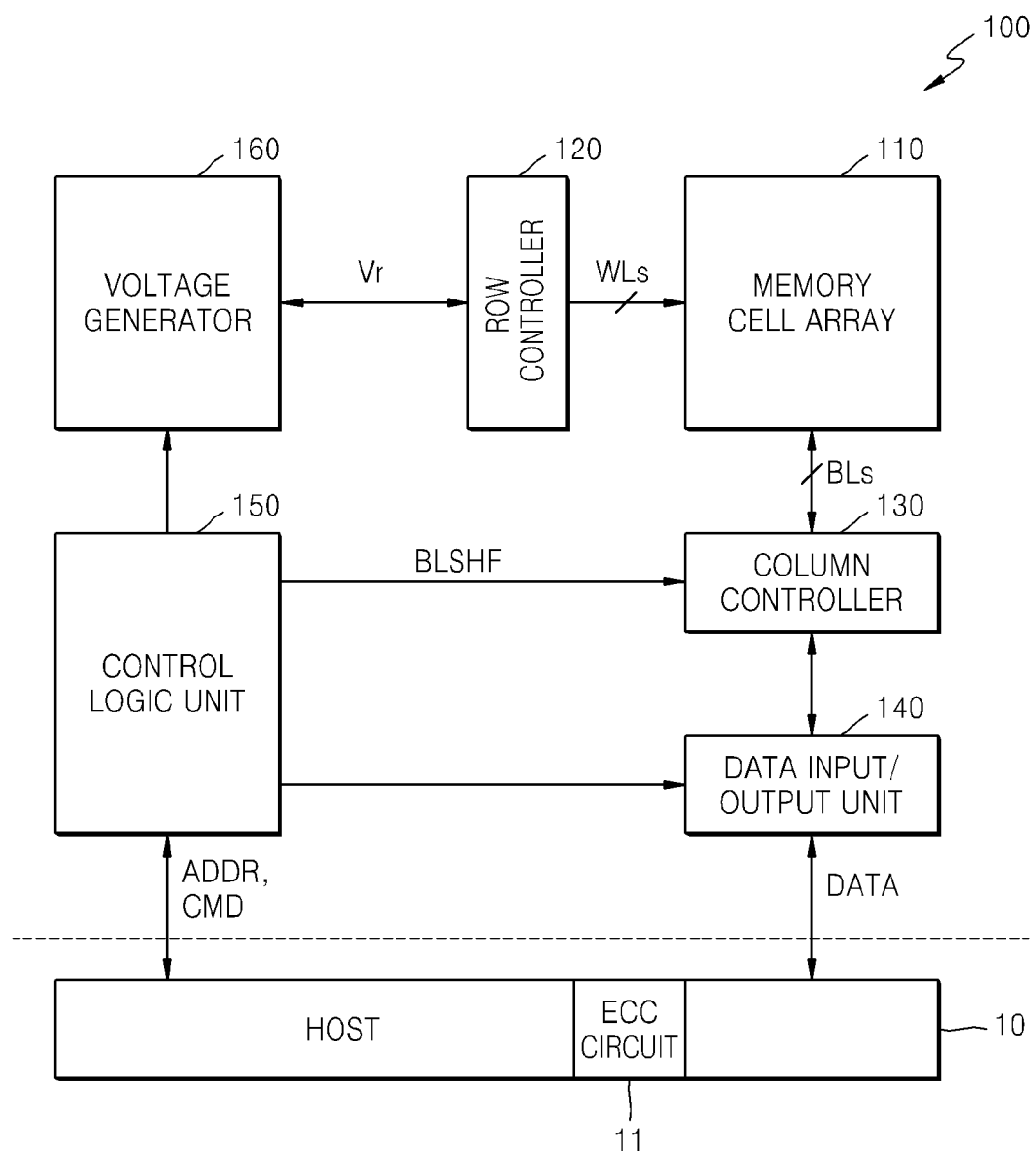
FIG. 1 is a block diagram of a nonvolatile memory device according to an embodiment of the inventive concept.

FIG. 1 is a block diagram of a nonvolatile memory device 100 according to an embodiment of the inventive concept.

Referring to FIG. 1, nonvolatile memory device 100 comprises a memory cell array 110, a row controller 120, a column controller 130, a data input/output unit 140, a control logic unit 150, and a voltage generator 160.

Row controller 120 is connected to word lines WLs of memory cell array 110. During a program operation, a read operation, or an erase operation on memory cell array 110, row controller 120 selects one of word lines WLs and applies a voltage to the selected word line.

Column controller 130 is connected to bit lines BLs of memory cell array 110. During a program operation, column controller 130 reads data stored in a memory cell of memory cell array 110, determines a state of the memory cell, applies a write control voltage to the memory cell through bit lines BLs, and writes data to the memory cell. Column controller 130 comprises read/write circuits connected to each bit line BL. The read/write circuits may further comprise a page buffer or a sense amplifier.

Row controller 120 and column controller 130 each comprise an address decoder (not illustrated) for selecting a word line and a bit line corresponding to an address ADDR. The address decoder receives address ADDR from an external host 10. The address decoder selects the word line by decoding a row address from address ADDR. The address decoder selects the bit line by decoding a column address from address ADDR.

Data input/output unit 140 is controlled by control logic unit 150, and it exchanges data DATA with host 10 outside nonvolatile memory device 100. Data input/output unit 140 transmits data DATA received from host 10 to the page buffer in column controller 130, and it transmits data DATA received from column controller 130 to host 10. Data input/output unit 140 typically comprises a data buffer. Where an error occurs during a read operation of nonvolatile memory device 100, host 10 corrects the error using an error correction code (ECC) circuit 11.

Control logic unit 150 controls a program operation or a read operation in response to a command CMD and address ADDR transmitted from host 10. Control logic unit 150 identifies a number of program/erase (P/E) cycles of blocks and pages corresponding to the address received with the read command. As the number of P/E cycles of the corresponding blocks and pages increases, threshold voltages of their memory cell may be shifted. To compensate for the shift of the threshold voltages of the memory cells during a read operation, control logic unit 150 can change a read voltage Vr of each page, or in other words, it can change the voltage applied to a selected word line. Also, control logic unit 150 can change a bit line connection signal BLSHF that connects the bit line to the page buffer in column controller 130 during the read operation. The voltage level of bit line connection signal BLSHF can be changed for each page.

Voltage generator 160 generates a read voltage Vr that is adjusted for each page during a read operation. For example, read voltage Vr may be increased by a different amount for each page. Predetermined pages are grouped so that read voltage Vr is increased by the same amount for each page in the group. Read voltages Vr for each page or group will be described more fully with reference to FIGS. 7 and 8.

Figure 2:
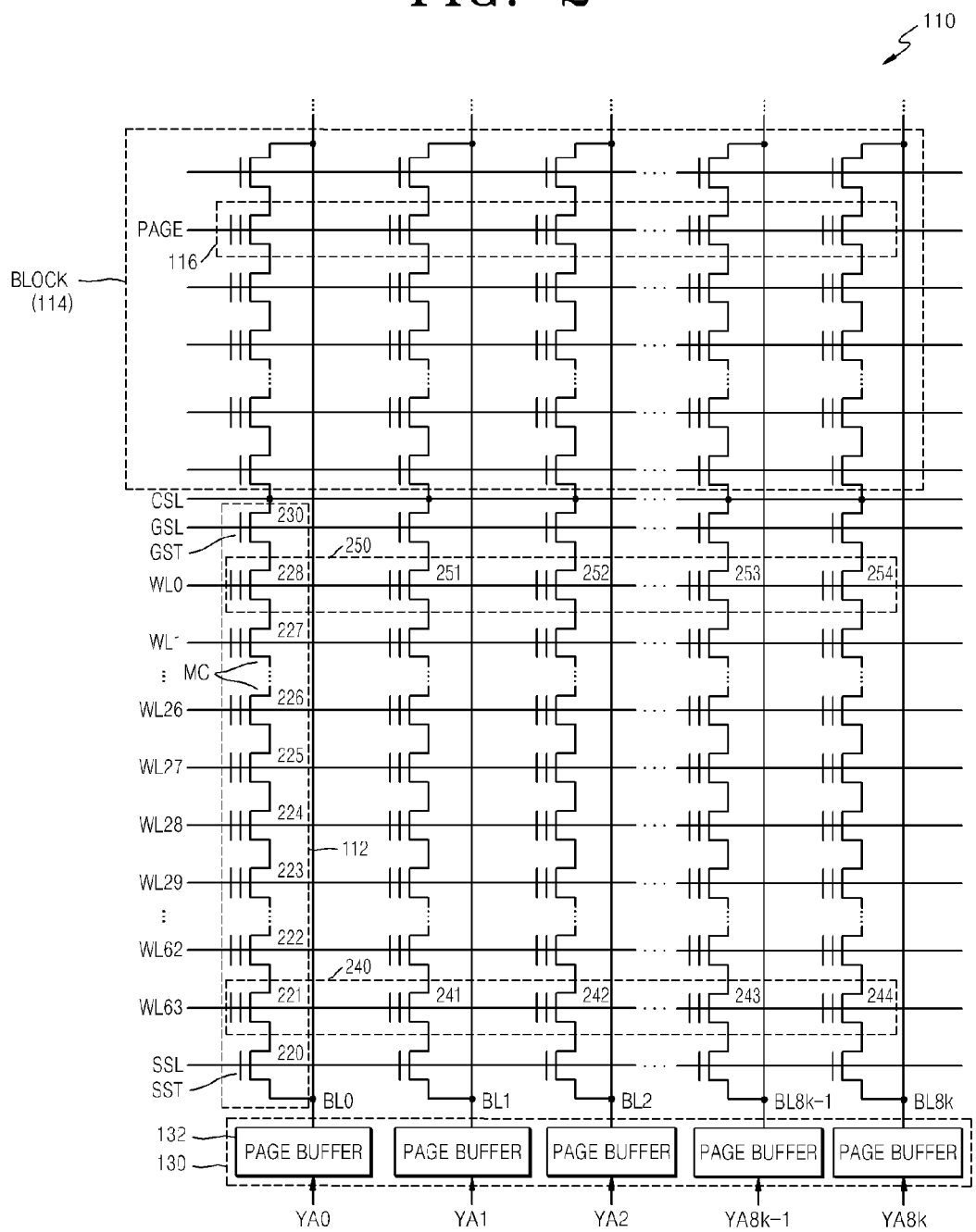
FIG. 2 illustrates a memory cell array and a column controller illustrated in FIG. 1 according to an embodiment of the inventive concept.

FIG. 2 illustrates memory cell array 110 and column controller 130 illustrated in FIG. 1 according to an embodiment of the inventive concept.

Referring to FIG. 2, memory cell array 100 comprises a plurality of NAND strings 112. Each NAND string 112 can comprise, for example, 64 memory cells MC connected to each other in series, a string selection transistor (SST) 220, and a ground selection transistor (GST) 230. GST 230 is connected to a common source line CSL, and SST 220 is connected to a bit line BL0. Control gates of memory cells MC arranged in each row are connected to word lines WL0, WL1, . . . , WL62, and WL63. A gate of GST 230 is connected to a ground selection line (GSL), and a gate of SST 220 is connected to a string selection line (SSL).

Although FIG. 2 shows 64 memory cells MC arranged in each of NAND strings 112, the number of memory cells per NAND string 112 can be modified in other embodiments. For example, NAND strings 112 may each include 8, 16, or 32 memory cells MC.

Memory cell array 110 comprises a plurality of blocks 114. An example block 114 is shown by a dashed box. Each block 114 comprises a plurality of NAND strings 112. In memory cell array 110, data is erased on a block-by-block basis. Memory cells connected to the same word line constitute a page 116, which is a unit used to write and read data. An example page 116 is shown by a dashed box.

Column controller 130 comprises a plurality of page buffers 132. Bit lines BL0, BL1, BL2, . . . , BL8$k$-1, and BL8$k$ are connected to page buffers 132 in a one-to-one correspondence. A structure in which page buffers 132 are connected respectively to bit lines BL0, BL1, BL2, . . . , BL8$k$-1, and BL8$k$ is referred to as an all bit line (ABL) structure. Address signals YA0, YA1, YA2, . . . , YA8$k$-1, and YA8$k$ are connected to page buffers 132 in a one-to-one correspondence.

Figure 3:
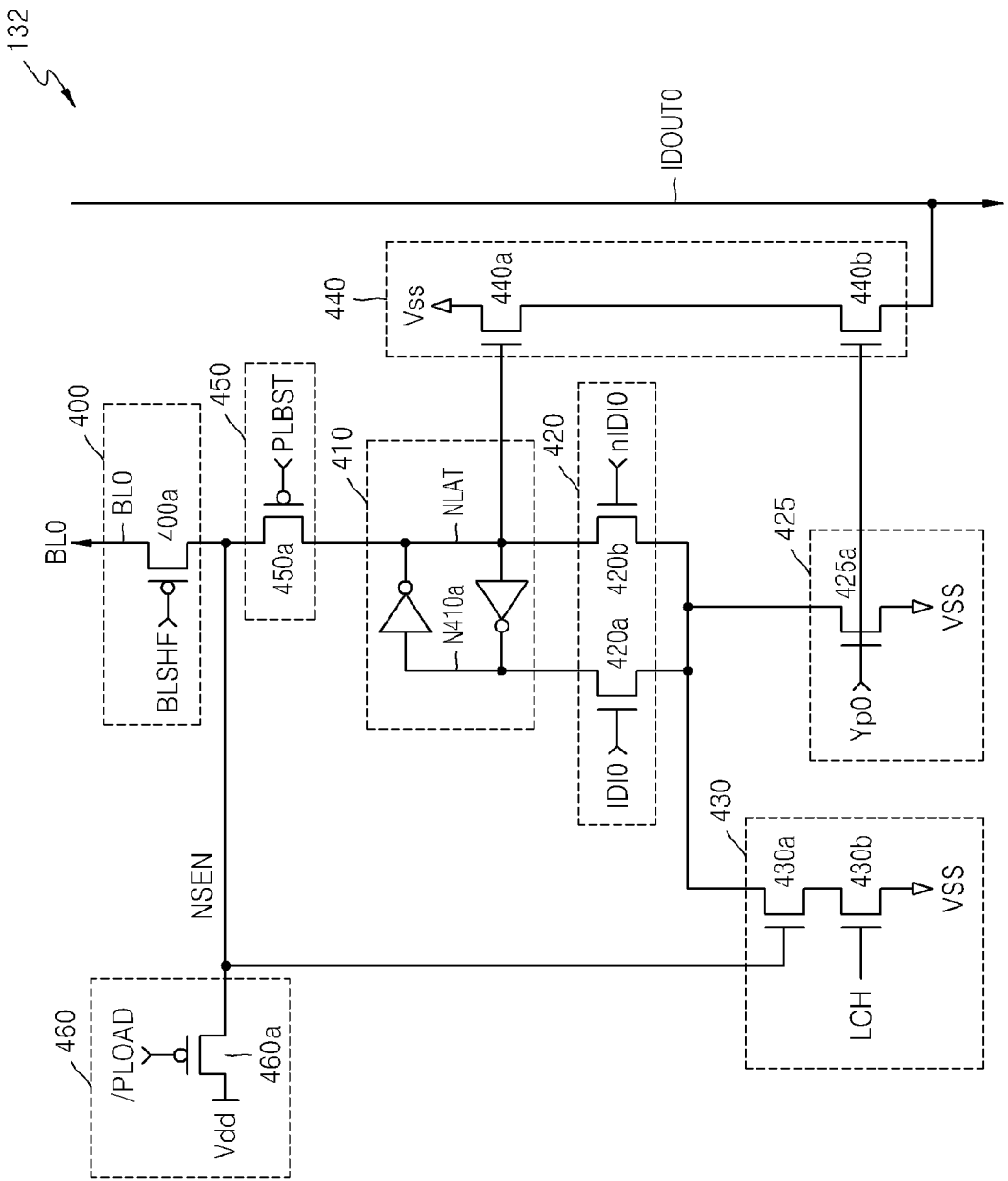
FIG. 3 illustrates a page buffer included in the column controller of FIG. 2 according to an embodiment of the inventive concept.

FIG. 3 illustrates one of page buffers 132 in column controller 130 of FIG. 2 according to an embodiment of the inventive concept.

Referring to FIG. 3, page buffer 132 comprises a sensing node NSEN, a bit line connector 400, a latch unit 410, a latch transmitter 420, a latch driver 425, a sensing response unit 430, an output driver 440, a buffer selecting unit 450, a precharging unit 460, and a data output line IDOUT0.

Bit line connector 400 controls a connection between bit line BL0 and sensing node NSEN in response to bit line connection signal BLSHF. In FIG. 3, bit line connector 400 is implemented by a bit line connection transistor 400$a$ comprising an NMOS transistor gated in response to bit line connection signal BLSHF. A voltage level of bit line BL0 is controlled in response to a voltage level of bit line connection signal BLSHF. Also, bit line connection transistor 400$a$ controls the voltage level of bit line BL0 in response to an active period of bit line connection signal BLSHF.

Latch unit 410 comprises a latch node NLAT that stores data corresponding to data of bit line BL0. Latch driver 425 is enabled in response to a buffer selection address Yp0, in order to provide a predetermined latch driving voltage. The latch driving voltage is a ground voltage VSS and is independent of data on first and second internal input lines IDIO and nIDIO provided to latch transmitter 420. Latch driver 425 comprises a latch driving transistor 425a that is gated in response to buffer selection address Yp0. Latch driver 425 can comprise, for example, an NMOS transistor with ground voltage VSS connected to a source terminal.

Latch transmitter 420 comprises first and second latch transmission transistors 420a and 420b. First latch transmission transistor 420a provides the latch driving voltage provided from latch driving transistor 425a of latch driver 425 to a node N410a of latch unit 410 in response to first internal input line IDIO. First latch transmission transistor 420a is connected to latch driving transistor 425a, and it can be an NMOS transistor gated in response to data on first internal input line IDIO. Where data in a logic state "H" is applied to first internal input line IDIO while buffer selection address Yp0 is in logic state "H", first latch transmission transistor 420a provides ground voltage VSS to node N410a of latch unit 410.

Second latch transmission transistor 420b provides the latch driving voltage provided from latch driving transistor 425a of latch driver 425 to latch node NLAT of latch unit 410 in response to second internal input line nIDIO. Second latch transmission transistor 420b is connected to latch driving transistor 425a and can be an NMOS transistor gated in response to data on second internal input line nIDIO. Where data in logic state "H" is applied to second internal input line nIDIO while buffer selection address Yp0 is in logic state "H", second latch transmission transistor 420b provides ground voltage VSS to latch node NLAT of latch unit 410.

Where first latch transmission transistor 420a is turned on, data in logic state "H" is stored in latch node NLAT of latch unit 410. On the other hand, where second latch transmission transistor 420b is turned on, data in a logic state "L" is stored in latch node NLAT of latch unit 410.

To transmit a sensing response voltage to latch transmitter 420, sensing response unit 430 is driven by sensing node NSEN and controls data stored in latch node NLAT. For example, the sensing response voltage is a ground voltage. Sensing response unit 430 comprises a sensing response transistor 430a and an output sensing transistor 430b.

Sensing response transistor 430a can be an NMOS transistor gated in response to data on sensing node NSEN. Output sensing transistor 430b typically comprises an NMOS transistor that is connected to sensing response transistor 430a in series, and ground voltage VSS is connected to a source terminal of output sensing transistor 430b. Where sensing response transistor 430a is turned on, output sensing transistor 430b responds to a read latch signal LCH to provide the sensing response voltage to latch unit 410 through latch transmitter 420. Latch node NLAT of latch unit 410 stores data corresponding to sensing node NSEN in response to the sensing response voltage.

Pre-charging unit 460 precharges sensing node NSEN to a predetermined precharge voltage. The precharge voltage is a power source voltage Vdd, and pre-charging unit 460 comprises a precharge transistor 460a. Precharge transistor 460a is a PMOS transistor having a source terminal connected to the power source voltage Vdd, and it is gated in response to a precharge signal /PLOAD.

Output driver 440 is enabled in response to buffer selection address Yp0. Where output driver 440 is enabled, output driver 440 drives data output line IDOUT0 at a predetermined drive voltage in response to the data stored in latch node NLAT of latch unit 410. Output driver 440 comprises a first output driving transistor 440a and a second output driving transistor 440b.

First output driving transistor 440a is gated by the data stored in latch node NLAT of latch unit 410. Where the data stored in latch node NLAT of latch unit 410 is in logic state "H", first output driving transistor 440a is turned on. Second output driving transistor 440b is connected to first output driving transistor 440a in series. Second output driving transistor 440b is gated in response to buffer selection address Yp0 to drive data output line IDOUT0 at a drive voltage. The drive voltage is ground voltage VSS connected to a source terminal of first output driving transistor 440a. Accordingly, where the data stored in latch node NLAT of latch unit 410 is in logic state "H", data output line IDOUT0 is driven by ground voltage VSS in response to a transition of buffer selection address Yp0 to logic state "H".

Buffer selecting unit 450 controls a connection between latch node NLAT of latch unit 410 and sensing node NSEN. Buffer selecting unit 450 comprises a buffer selection transistor 450a. Buffer selection transistor 450a can be an NMOS transistor gated in response to a buffer selection signal PBLST. Where a voltage level of buffer selection signal PBLST is changed to logic state "H", data on latch node NLAT of latch unit 410 is transmitted to sensing node NSEN through buffer selection transistor 450a and is further transmitted to bit line BL0.

Figure 4:
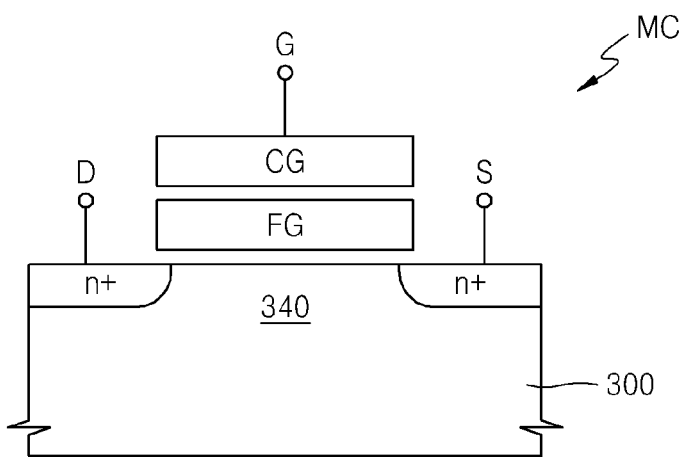
FIG. 4 is a cross-sectional diagram of a memory cell of FIG. 2 according to an embodiment of the inventive concept.

FIG. 4 is a cross-sectional diagram of a memory cell MC of FIG. 2 according to an embodiment of the inventive concept.

Referring to FIG. 4, a source S and a drain D are formed in a semiconductor substrate 300, and a channel area 340 is interposed between source S and drain D. A floating gate FG is formed on channel area 340 with a thin insulation film (not shown) interposed therebetween. A control gate CG is formed on floating gate FG with an insulation film (not shown) interposed therebetween. Voltages used in a program operation, an erase operation, or a read operation are applied to source S, drain D, floating gate FG, control gate CG, and semiconductor substrate 300.

Figure 5:
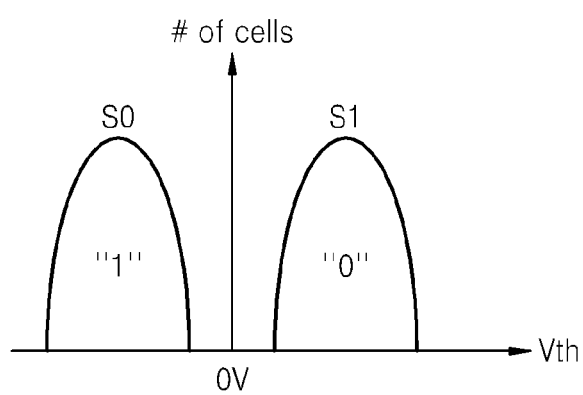
FIG. 5 illustrates threshold voltage distribution of a single level memory cell according to an embodiment of the inventive concept.

Memory cell MC stores analog data or digital data. Moreover, memory cell MC can be a single level memory cell storing 1 bit digital data, or a multi-level memory cell storing multi-bit data. A threshold voltage range of memory cell MC when 1 bit digital data is divided into different regions corresponding to logic states "1" and "0", as illustrated in FIG. 5. Memory cell MC has a negative threshold voltage after it is erased, which corresponds to logic state "1", and it has a positive threshold voltage after it is programmed, which corresponds to logic state "0".

Where the threshold voltage of memory cell MC is negative and a voltage of 0V is applied to control gate CG, memory cell MC is turned on, indicating that memory cell MC stores logic state "1". Where memory cell MC has a positive threshold voltage and a voltage of 0V is applied to control gate CG, memory cell MC is not turned on, indicating that memory cell MC stores logic state "0".

Figure 6:
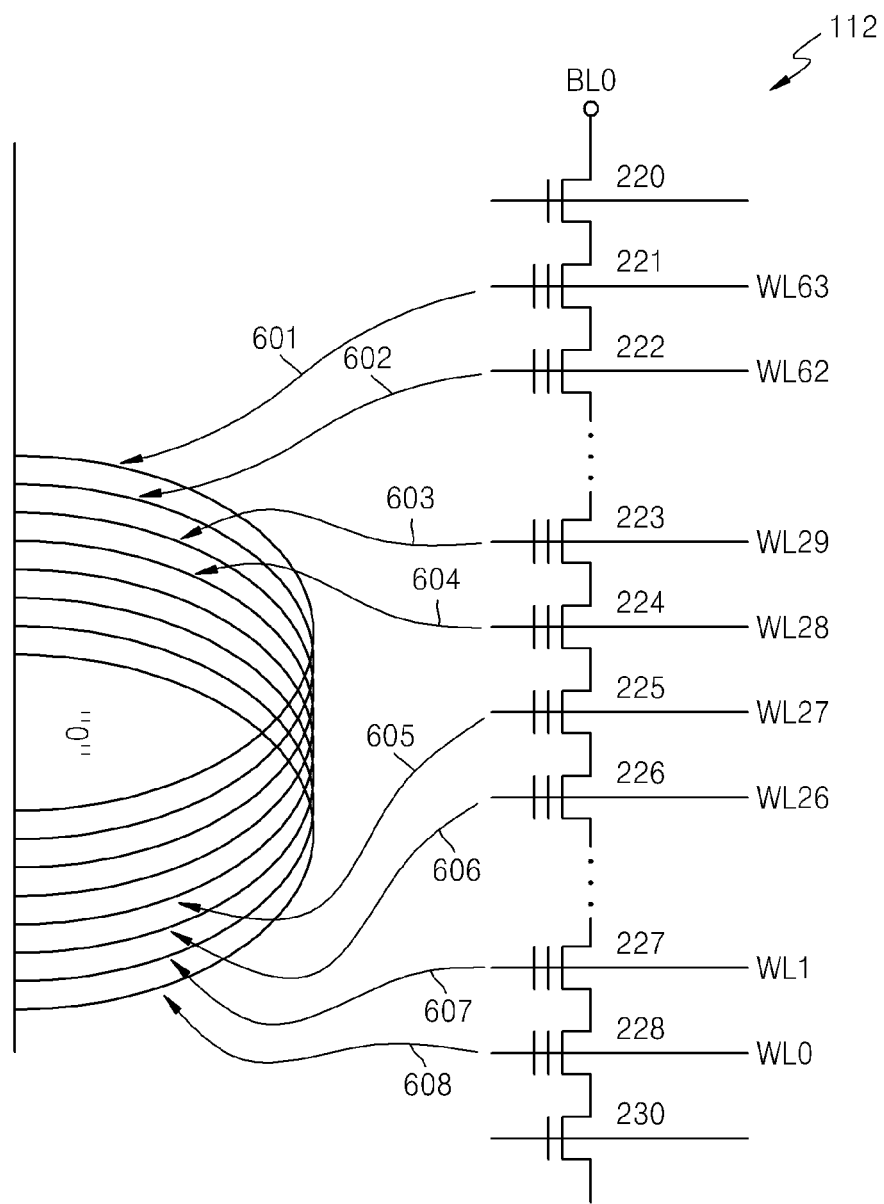
FIG. 6 illustrates a threshold voltage shift of memory cells in each of a plurality of NAND strings of FIG. 2 according to an embodiment of the inventive concept.

FIG. 6 illustrates a threshold voltage shift of memory cells 221 though 228 in NAND strings 112 of FIG. 2 according to an embodiment of the inventive concept. In FIG. 6, it is assumed that memory cells 221 though 228 connected to each other in series between SST 220 and GST 230 are programmed to logic state "0". Even if threshold voltages of memory cells 221 through 228 are uniform after the programming, the threshold voltages may be shifted over time.

Factors affecting the threshold voltages can include a temperature change, process variations between the memory cells, and program, read, and erase disturbances of the memory cells. In addition, the threshold voltages can be shifted due to loss of charges injected in floating gates of memory cells 221 through 228. Also, even if the threshold voltages of memory cells 221 through 228 are not substantially changed, the threshold voltage of sensed memory cells 221 through 228 may be changed according to changes of circuits such as a high-voltage switch that provides a high-voltage to voltage generator 160 of FIG. 1 or a word line. A measured shift of the threshold voltages of memory cells 221 through 228 can also occur due to a change of measurement circuitry such as various peripheral circuits.

After memory cells 221 through 228 are programmed to logic state "0", memory cell 221, which is located close to SST 220, has a threshold voltage distribution 601, and memory cell 222 has a threshold voltage distribution 602. Similarly, memory cells 223, 224, 225, and 226 have respective threshold voltage distribution 603, 604, 605, and 606. The threshold voltage of memory cell 227 located close to GST 230 corresponds to threshold voltage distribution 607, and the threshold voltage of memory cell 228 corresponds to threshold voltage distribution 608. Memory cell 221 located close to SST 220 has the lowest threshold voltage distribution and memory cell 228 located close to GST 230 has the highest threshold voltage distribution.

Memory cell 221 is self-boosted in a program operation by applying power source voltage Vdd to bit line BL0. This self-boosting method is employed to prevent program disturbances. Because a program voltage is connected to all memory cells connected to the word lines, and a memory cell that is not selected on the same word line (hereinafter, a "program prohibition cell") may be programmed unintentionally. Unintentional programming of the program prohibition cell on the selected word line is referred to as "program disturbance."

To prevent a program disturbance, self-boosting is applied to memory cell 221. Where a pass voltage Vpass or a program voltage Vpgm is applied to a word line WL63 of memory cell 221, channel conduction may occur due to capacitive coupling between word line WL63 of memory cell 221 and a channel area. Such a state is referred to as self boosting. The self-boosting increases a voltage of the channel area, which can cause electrons stored in the floating gate of memory cell 221 to leak. This, in turn, can decrease a threshold voltage of memory cell 221.

In a read operation, bit line BL0 is precharged to power source voltage Vdd, read voltage Vr is applied to a word line of a selected memory cell, pass voltage Vpass is applied to a word line of a non-selected memory cell, and power source voltage Vdd is applied to a gate of GST 230. For example, where pass voltage Vpass is applied to word line WL0 of memory cell 228, channel boosting is accomplished by pass voltage Vpass. GST 230 is turned on and ground voltage VSS is connected to memory cell 228. A strong electric field is formed between the channel boosting by pass voltage Vpass and ground voltage VSS in memory cell 228. Due to the strong electric field, electrons in the current flowing through NAND strings 112 are injected to the floating gate of memory cell 228, increasing its threshold voltage.

In FIG. 2, threshold voltages of memory cells 241 through 244 connected to word line WL63 of memory cell 221 decrease compared with threshold voltages for programming. In other words, threshold voltages of memory cells 221 and 241 through 244 of a page 240 located close to SST 220 decrease. Also, threshold voltages of memory cells 251 through 254 connected to word line WL0 of memory cell 228 increase compared with threshold voltages for programming. In other words, threshold voltages of memory cells 228 and 251 through 254 of a page 250 located close to GST 230 increase. A threshold voltage shift of each page generates a read error, deteriorating the reliability of nonvolatile memory device 100.

As described above, threshold voltages of programmed memory cells may be shifted in each page. Accordingly, a read operation may be performed in consideration of the shifted threshold voltages. In particular, to compensate for the shifted threshold voltages, a read voltage Vr may be adjusted for each page. For example, a read voltage Vr of 0 V may be applied to word line WL63 of page 240 located close to SST 220 and having a lowest threshold voltage distribution. Meanwhile, a read voltage Vr of word line WL62 may be set to, for example, about 10 mV, and a read voltage Vr of word line WL61 may be set to, for example, about 20 mV. In other words, a voltage level increased by a predetermined increment of about 10 mV may be applied to each word line WL[63:0]. Read voltage Vr is generated from voltage generator 160 of FIG. 1.

To compensate for the shifted threshold voltage, adjusted read voltages can be applied according to page groups or word lines, as illustrated in FIGS. 7 and 8. In FIG. 7, 64 word lines WL[63:0] are divided into five groups including a group G0 including word lines WL0 through WL13, a group G1 including word lines WL14 through WL27, a group G2 including word lines WL28 through WL41, a group G3 including word lines WL42 through WL55, and a group G4 including word lines WL56 through WL63. A read voltage level of each group G0 through G4 is increased by 0.5 V based on a voltage of 0 V set on word line WL63. The adjusted read voltage Vr for each group is generated by voltage generator 160 of FIG. 1.

In FIG. 8, 64 word lines WL[63:0] are divided into nine groups including a group G10 including word lines WL0 through WL6, a group G11 including word lines WL7 through WL13, a group G12 including word lines WL14 through WL20, a group G13 including word lines WL21 through WL27, a group G14 including word lines WL28 through WL34, a group G15 including word lines WL35 through WL41, a group 16 including word lines WL42 through WL48, a group G17 including word lines WL49 through WL55, and a group G18 including word lines WL56 through WL63. A read voltage level of each group G10 through G18 is increased by 0.25 V based on a voltage of 0V on word line WL63. The adjusted read voltage Vr for each group is generated by voltage generator 160 of FIG. 1.

The grouping of word lines is not limited to the above examples. Where the number of groups is large, threshold voltages adjusted for each page may be accurately compensated for during a read operation. However, a large number of groups may require a large number of voltage generators. On the other hand, where the number of groups is small, a small number of voltage generators may be required. Accordingly, determining the number of groups may require these and other tradeoffs.

Figure 9:
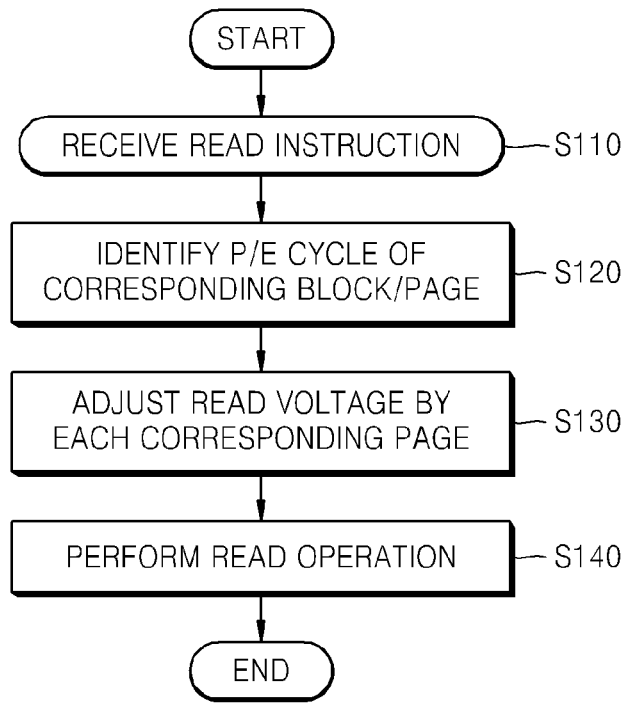
FIG. 9 is a flowchart illustrating a method of reading a nonvolatile memory device according to an embodiment of the inventive concept.

FIG. 9 is a flowchart illustrating a method of reading a nonvolatile memory device according to an embodiment of the inventive concept. The method identifies a number of P/E cycles of a block and page, adjusts a read voltage for each page, and performs a read operation using the adjusted read voltage.

Referring to FIG. 9, the nonvolatile memory device receives a read instruction from an external source such as a memory controller (S110). Next, the nonvolatile memory device identifies a number of P/E cycles of a block and page corresponding to an address received with the read instruction (S120). As the number of P/E cycles of the corresponding block and page increases the threshold voltage distribution of the block or page may shift as illustrated, for instance, in FIG. 6.

Next, a read voltage of the page is adjusted according to the identified number of P/E cycles (S130). This adjustment can be performed, for example, as described with reference to FIG. 7 or 8. Finally, a read operation is performed using the adjusted read voltage (S140).

In the example of FIG. 9, a read operation is performed with an adjusted value of read voltage Vr for each page. This can compensate for shifting threshold voltage distributions of different pages, which can improve the reliability of the nonvolatile memory device.

Referring again FIG. 6, the threshold voltage of memory cell 221 located close to SST 220 is the lowest threshold voltage distribution 601, and the threshold voltage of memory cell 228 located close to GST 230 is the highest threshold voltage distribution 608. Accordingly, in a method of compensating for the low threshold voltage of memory cell 221, a voltage level precharged to bit line BL0 may be set to be high during a read operation. To compensate for the high threshold voltage of memory cell 228, a voltage level precharged to bit line BL0 may be set to be low during a read operation.

A precharge voltage is applied to bit line BL0 through bit line connector 400 of page buffer 132 of FIG. 3. Bit line connector 400 adjusts the level of the precharge voltage according to a voltage level of bit line connection signal BLSHF. Where the voltage level of bit line connection signal BLSHF is high, the level of the precharge voltage of bit line BL0 is high. On the other hand, where the voltage level of bit line connection signal BLSHF is low, the level of the precharge voltage of bit line BL0 is low.

Where a channel boosting effect increases in a read operation, a threshold voltage of a memory cell may increase. Channel boosting may be affected by the precharge voltage level of bit line BL0. As the precharge voltage level of bit line BL0 increases, the channel boosting effect tends to increase, which can lead to an increase in the threshold voltage of a memory cell. On the other hand, as the precharge voltage level of bit line BL0 decreases, the channel boosting effect tends to decrease, which can lead to a decrease in the threshold voltage of a memory cell.

To compensate for the low threshold voltage of memory cell 221, the voltage level of bit line connection signal BLSHF may be increased during a read operation of memory cell 221. Accordingly, the precharge voltage level transmitted to bit line BL0 is increased in order to increase the threshold voltage of memory cell 221. To compensate for the high threshold voltage of memory cell 228, the voltage level of bit line connection signal BLSHF decreases during a read operation of memory cell 228. Accordingly, the precharge voltage level transmitted to bit line BL0 is decreased in order to decrease the threshold voltage of memory cell 228.

Figure 10:
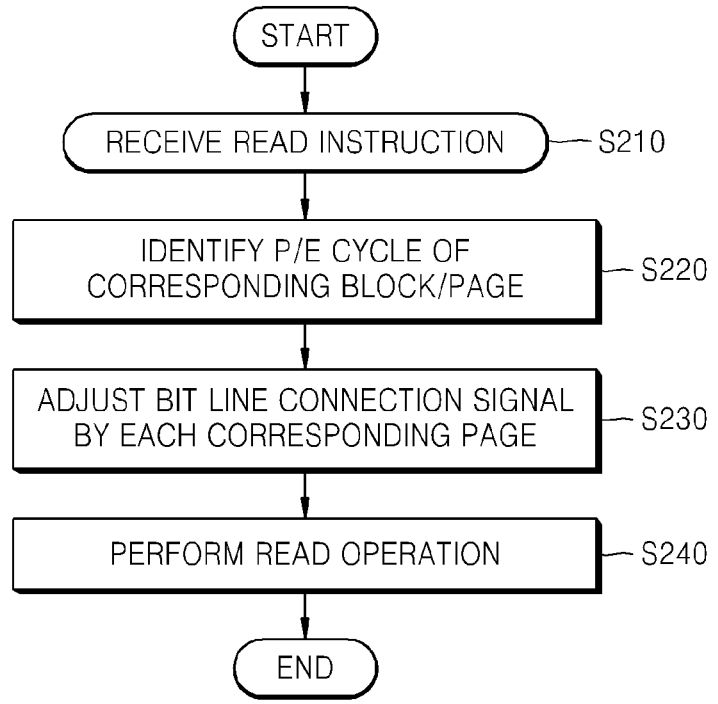
FIG. 10 is a flowchart illustrating a method of reading a nonvolatile memory device according to another embodiment of the inventive concept.

FIG. 10 is a flowchart illustrating a method of reading a nonvolatile memory device according to an embodiment of the inventive concept. The method identifies a number of P/E cycles of a block and page, adjusts bit line connection signal BLSHF for each page according to the detected number of P/E cycles, and performs a read operation using the adjusted bit line connection signal BLSHF.

Referring to FIG. 10, the nonvolatile memory device receives a read instruction from an external source such as a memory controller (S210). Next, the nonvolatile memory device identifies the number of P/E cycles of a block and page corresponding to an address received with the read instruction (S220). As number of P/E cycles of the block and page increases, the threshold voltage distributions of the block and page tend to shift as illustrated, for example, in FIG. 6.

Next, a read voltage of bit line connection signal BLSHF is adjusted for each corresponding page (S230). For instance, the voltage level of bit line connection signal BLSHF with respect to page 250 of FIG. 2 located close to GST 230 of FIG. 2 may be adjusted to be relatively low, and the voltage level of bit line connection signal BLSHF with respect to page 240 of FIG. 2 located close to SST 220 of FIG. 2 may be adjusted to be relatively high, as described above in relation to the other figures. FIGS. 7 and 8 show examples of applying of different read voltages to grouped pages or word lines. The voltage level of bit line connection signal BLSHF for each of these groups may be adjusted accordingly, as described above. Finally, a read operation is performed using the adjusted voltage level of bit line connection signal BLSHF (S140).

In the embodiment of FIG. 10, a read operation is performed with bit line connection signal BLSHF adjusted for each page in consideration of a threshold voltage shift of each page. This can be used to compensate for the shifted threshold voltage, improving the reliability of the nonvolatile memory device.

Figure 11:
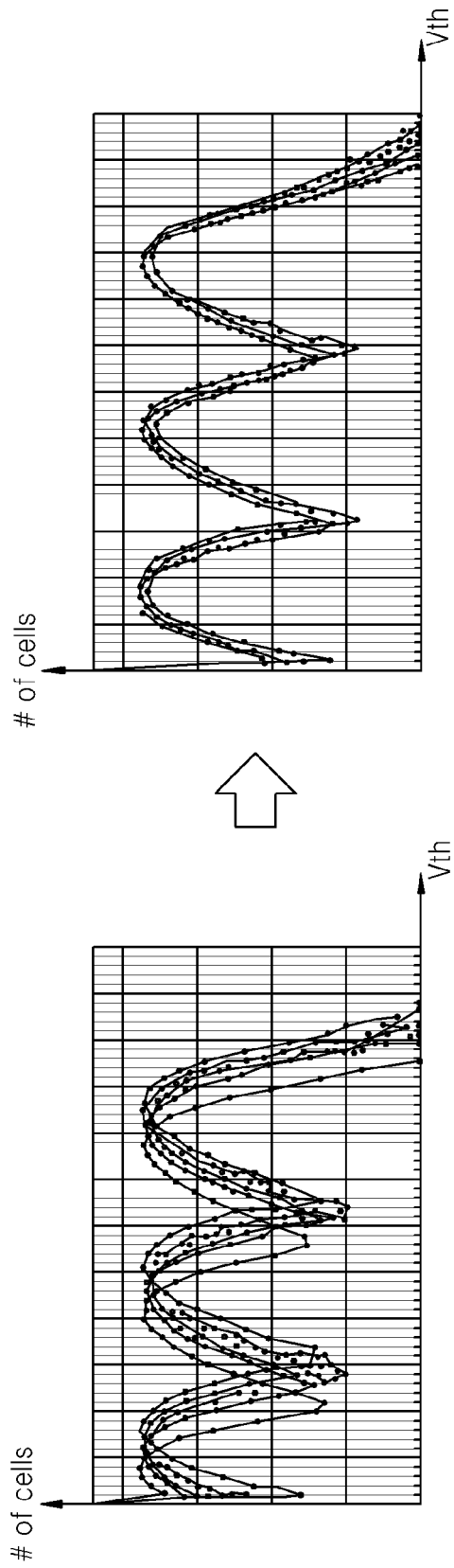
FIG. 11 is a graph illustrating a threshold voltage distribution of memory cells read by the method of FIG. 9 or 10 according to an embodiment of the inventive concept.

FIG. 11 is a graph illustrating a threshold voltage distribution of a memory cell read by the method of FIG. 9 or 10 according to an embodiment of the inventive concept.

Referring to FIG. 11, a threshold voltage is decreased or increased in each page due to factors such as channel boosting, program disturbance, or read disturbance. Because a read operation is performed by adjusting a read voltage of each page as in FIG. 9 or by adjusting a bit line connection signal for each page as in FIG. 10, the threshold voltage increased or decreased by each page is compensated.

Figure 12:
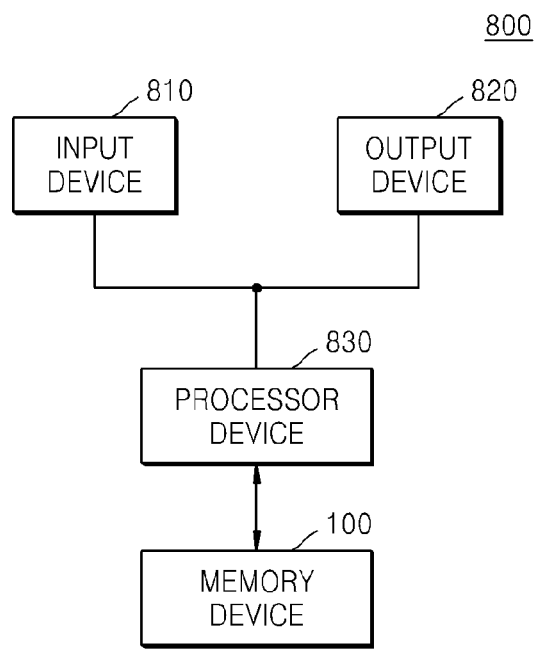
FIG. 12 is a block diagram of an electronic system incorporating a nonvolatile memory device according to an embodiment of the inventive concept.

FIG. 12 is a block diagram of an electronic system 800 incorporating nonvolatile memory device 100 of FIG. 1 according to an embodiment of the inventive concept.

Referring to FIG. 12, electronic system 800 comprises an input device 810, an output device 820, a processor 830, and nonvolatile memory device 100. Processor 830 controls input device 810, output device 820, and nonvolatile memory device 100 through corresponding interfaces. Processor 830 comprises at least one of a microprocessor, a digital signal processor, a micro-controller, and logic elements performing similar functions. Input device 810 and output device 820 typically comprise at least one of a keypad, a keyboard, and a display device.

Nonvolatile memory device 100 can perform a read operation with a read voltage adjusted for each page. For example, a read voltage of a page located close to a GST may be set higher than a read voltage of a page located close to a SST. Also, nonvolatile memory device 100 can perform a read operation with a bit line connection signal adjusted for each page. For example, the bit line connection signal may be set with an increased voltage level for pages located close to the GST. The adjusted read voltage or bit line connection signal can compensate for threshold voltages that have been increased or decreased due to factors such as electron leakage or program disturbances.

Figure 13:
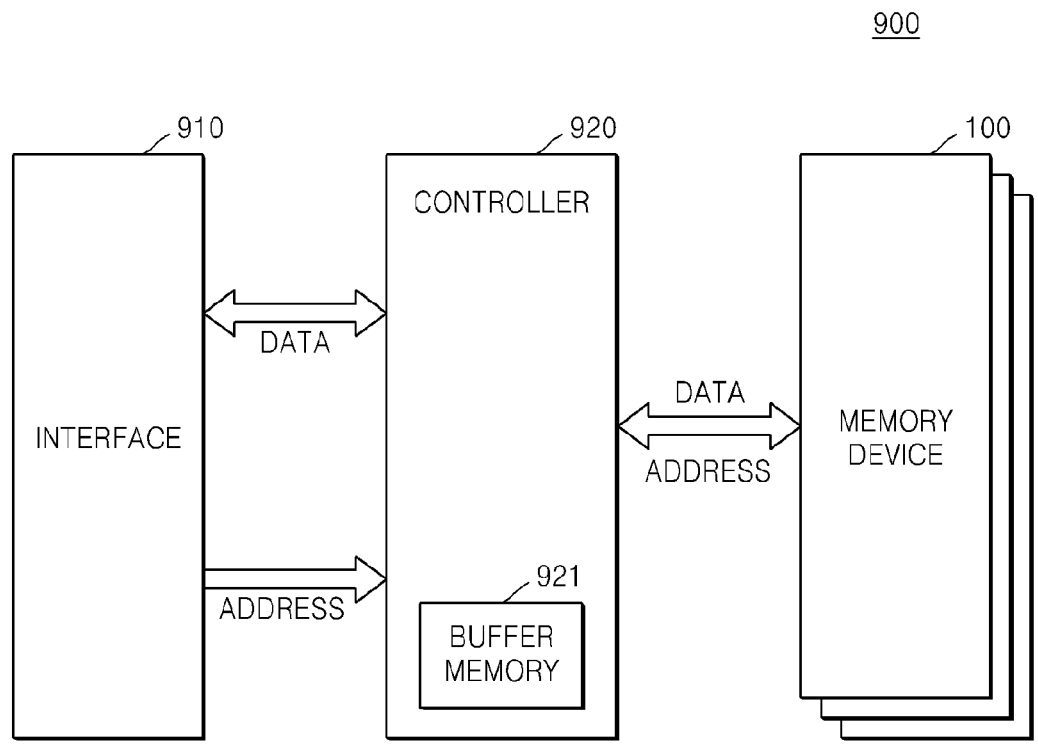
FIG. 13 is a block diagram of a memory system incorporating the nonvolatile memory device of FIG. 1 according to an embodiment of the inventive concept.

FIG. 13 is a block diagram of a memory system 900 incorporating nonvolatile memory device 100 of FIG. 1 according to an embodiment of the inventive concept.

Referring to FIG. 13, memory system 900 comprises an interface unit 910, a controller 920, and nonvolatile memory device 100. Interface unit 910 provides an interface between memory system 900 and a host. Interface unit 910 implements a data exchange protocol to allow interfacing between memory system 900 and the host. For instance, interface unit 910 can be configured to communicate with a protocol such as universal serial bus (USB), multi-media card (MMC), peripheral component interconnect-express (PCI-E), serial-attached SCSI (SAS), serial advanced technology attachment (SATA), parallel advanced technology attachment (PATA), small computer system interface (SCSI), enhanced small disk interface (ESDI), or integrated drive electronics (IDE).

Controller 920 receives data and addresses provided from an external source through interface unit 910. Controller 920 accesses nonvolatile memory device 100 based on the data and address provided from the host. Controller 920 transmits data read by nonvolatile memory device 100 to the host through interface unit 910.

Controller 920 comprises a buffer memory 921 that temporarily stores write data provided from the host or data read by nonvolatile memory device 100. Buffer memory 921 can also support a caching operation to provide cached copies of data stored in nonvolatile memory device 100 to the host in response to a read request. In general, a data transmission speed of a host bus (e.g., a SATA or SAS bus) may be significantly faster than a data transmission speed of a memory channel in memory system 900. Accordingly, where the interface speed of the host is sufficiently high, buffer memory 921 may be used to buffer data to prevent performance deterioration due to the speed difference.

Nonvolatile memory device 100 can perform a read operation with a read voltage adjusted for each page, or with a bit line connection signal adjusted for each page, as described above. The adjusted read voltage or bit line connection signal can compensate for threshold voltages that have been increased or decreased due to factors such as electron leakage or program disturbances.

Figure 14:
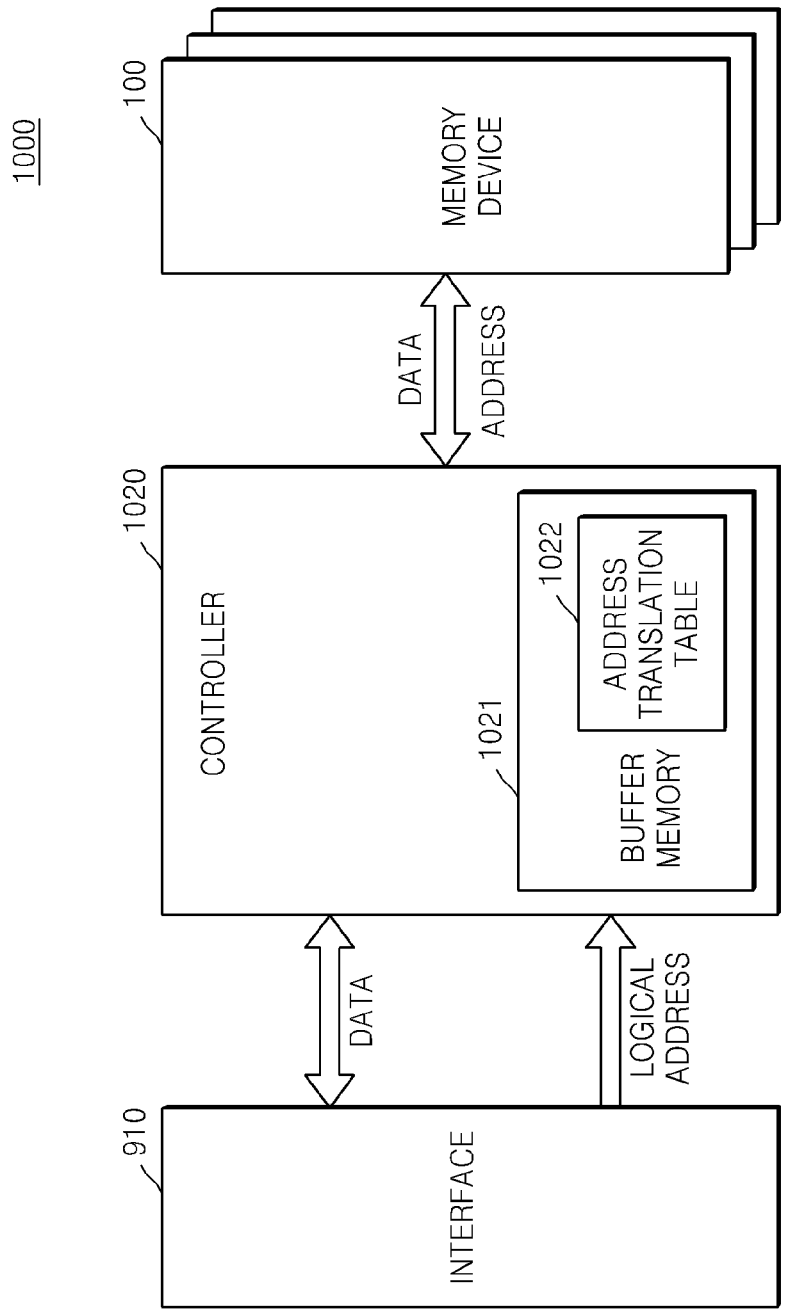
FIG. 14 is a block diagram of a memory system incorporating the nonvolatile memory device of FIG. 1 according to an embodiment of the inventive concept.

FIG. 14 is a block diagram of a memory system 1000 incorporating nonvolatile memory device 100 of FIG. 1 according to an embodiment of the inventive concept.

Referring to FIG. 14, memory system 1000 comprises interface unit 910, a controller 1020, and nonvolatile memory device 100. As illustrated in FIG. 14, interface unit 910 implements a data exchange protocol for communication with the host. Nonvolatile memory device 100 performs a read operation by adjusting a read voltage for each page or adjusting a bit line connection signal for each page as discussed above.

In some embodiments, nonvolatile memory device 100 can be incorporated in a semiconductor disk device such as a solid state drive (SSD). Such SSDs can be used, for example, to replace hard disk drives (HDDs).

Controller 1020 comprises a buffer memory 1021 having an address translation table 1022. Controller 1020 translates a logical address provided from interface unit 910 into a physical address based on information stored in address translation table 1022. Controller 1020 accesses nonvolatile memory device 100 based on the physical address.

Memory systems 900 and 1000 illustrated in FIGS. 13 and 14, respectively, can be installed in an information processing device such as a personal digital assistant (PDA), a portable computer, a web tablet, a digital camera, a portable media player (PMP), a mobile phone, a wireless phone, or a laptop computer. Memory systems 900 and 1000 can include a MMC card, a secure digital (SD) card, a micro SD card, a memory stick card, an ID card, a personal computer memory card international association (PCMCIA) card, a chip card, a USB card, a smart card, or a compact flash (CF) card.

Figure 15:
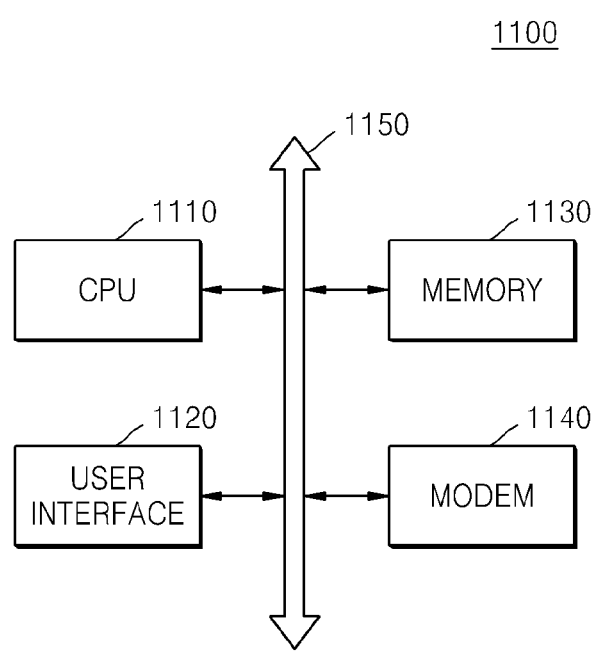
FIG. 15 is a block diagram of a computer system incorporating the nonvolatile memory device of FIG. 1 according to an embodiment of the inventive concept.

FIG. 15 is a block diagram of a computer system 1100 incorporating nonvolatile memory device 100 of FIG. 1 according to an embodiment of the inventive concept.

Referring to FIG. 15, computer system 1100 comprises a central processing unit (CPU) 1110 that is electrically connected to a system bus 1150, a user interface 1120, a memory 1130, and a modem 1140 such as baseband chipset. User interface 1120 transmits data through a communication network or receives data from a communication network. User interface 1120 can be a wired or wireless interface, and it can include an antenna or a wire/wireless transceiver. Data provided through user interface 1120 or model 1140 or processed by CPU 1110 is stored in memory 1130.

Memory 1130 can comprise a volatile memory device such as DRAM and/or a nonvolatile memory device such as a flash memory. Memory 1130 can comprise a NOR flash memory, a NAND flash memory, or a fusion flash memory (e.g., a memory combining an SRAM buffer, a NAND flash memory, and NOR interface logic), wherein the NOR flash memory performs a read operation by adjusting a read voltage by each page or adjusting a bit line connection signal by each page.

Where computer system 1100 is a mobile device, a battery may be provided to apply a driving voltage of computer system 1100. Although not illustrated, computer system 1100 can further comprise an application chip set, a cameral image processor (CIP), or an input/output device.

Where computer system 1100 is a device that performs wireless communication, it may conform to one of various standard protocols such as code division multiple access (CDMA), global system for mobile communication (GSM), North American multiple access (NADC), or CDMA 2000.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device, comprising:
    a memory cell array comprising a plurality of memory cells connected in series between a string selection transistor connected to a bit line and a ground selection transistor connected to a source line;
    a voltage generator that provides read voltages to word lines of memory cells selected from among the plurality of memory cells during a read operation; and
    a page buffer that senses a level of the bit line after applying a precharge voltage to the bit line in response to a bit line connection signal during the read operation,
    wherein the read voltages of the selected memory cells differ from each other according to their respective distances from the string selection transistor, and wherein a voltage level of the bit line connection signal of a selected memory cell located closest to the string selection transistor is set to be higher than a voltage level of the bit line connection signal for a selected memory cell located closest to the ground selection transistor.

2. The nonvolatile memory device of claim 1, wherein the read voltage of a selected memory cell located closest to the string selection transistor is lower than the read voltage of a selected memory cell located closest to the ground selection transistor.

3. The nonvolatile memory device of claim 1, wherein read voltages of selected memory cells located adjacent to the ground selection transistor are greater by a predetermined amount compared with read voltages of selected memory cells located adjacent to the string selection transistor.

4. The nonvolatile memory device of claim 1, wherein the word lines are divided into at least two groups, and different read voltages are applied to the word lines of each group.

5. The nonvolatile memory device of claim 4, wherein the read voltages applied to the word lines of each group increase from a group located closest to the string selection transistor toward a group located closest to the ground selection transistor.

6. The nonvolatile memory device of claim 1, wherein a voltage level of the bit line connection signal decreases by a predetermined amount from a selected memory cell located closest to the string selection transistor toward a selected memory cell located closest to the ground selection transistor.

7. The nonvolatile memory device of claim 1, wherein the word lines connected to the memory cells are divided into at least two groups, and the bit line connection signal has a different level for each of the at least two groups.

8. The nonvolatile memory device of claim 7, wherein the bit line connection signal for each group decreases from a group located closest to the string selection transistor toward a group located closest to the ground selection transistor.

9. A method of reading a nonvolatile memory device comprising a plurality of strings each comprising a plurality of memory cells connected in series between a string selection transistor connected to a bit line and a ground selection transistor connected to a source line, wherein the memory cells of the plurality of strings are organized in pages each connected to a common word line and blocks each comprising a plurality of pages, the method comprising:
 identifying a number of program/erase (P/E) cycles of a page in a block corresponding to an address received with a read instruction;
 performing a read operation by adjusting a read voltage applied to the page according to a distance between the page and the string selection transistor; and
 sensing a level of the bit line after applying a precharge voltage to the bit line in response to a bit line connection signal,
 wherein a voltage level of the bit line connection signal for a page located closest to the string selection transistor is set to be higher than a voltage level of the bit line connection signal for a page located closest to the ground selection transistor.

10. The method of claim 9, wherein a read voltage applied to a page located closest to the string selection transistor lower than a read voltage of a page located closest to the ground selection transistor.

11. The method of claim 9, wherein read voltages of memory cells located adjacent to the ground selection transistor are greater by a predetermined amount compared with read voltages of memory cells located adjacent to the string selection transistor.

12. A method of reading a nonvolatile memory device comprising memory cells organized in blocks each comprising a plurality of pages, the method comprising:
 receiving a read instruction designating a selected block of memory cells;
 identifying a number of program/erase (P/E) cycles for a selected page within the selected block;
 adjusting a read voltage or a bit line connection signal for the selected page according to the number of P/E cycles and a distance between the selected page and a string selection transistor or a ground selection transistor; and
 performing a read operation on the selected page using the adjusted read voltage or bit line connection signal;
 wherein the bit line connection signal is decreased in proportion to the distance between the selected page and the string selection transistor, or increased in proportion to the distance between the selected page and the ground selection transistor.

13. The method of claim 12, wherein the read voltage is decreased in proportion to the distance between the selected page and the ground selection transistor.

14. The method of claim 12, wherein the read voltage is increased in proportion to the distance between the selected page and the string selection transistor.

* * * * *